United States Patent [19]

Busser

[11] 4,327,693

[45] May 4, 1982

[54] SOLENOID DRIVER USING SINGLE BOOST CIRCUIT

[75] Inventor: Darryl W. Busser, Southfield, Mich.

[73] Assignee: The Bendix Corporation, Southfield, Mich.

[21] Appl. No.: 117,679

[22] Filed: Feb. 1, 1980

[51] Int. Cl.³ .......................................... H01H 47/32
[52] U.S. Cl. ................................. 123/490; 361/155; 361/191
[58] Field of Search ............... 123/490, 478; 361/152, 361/154, 155, 156, 191

[56] References Cited

U.S. PATENT DOCUMENTS

| | | | |
|---|---|---|---|
| 3,665,901 | 5/1972 | Monpetit et al. | 361/191 X |
| 3,882,829 | 5/1975 | Sasaki | 123/490 X |
| 3,889,162 | 6/1975 | Myers | 361/155 |
| 4,173,030 | 10/1979 | Rabe | 123/490 X |

*Primary Examiner*—Tony M. Argenbright
*Attorney, Agent, or Firm*—Markell Seitzman; Russel C. Wells

[57] ABSTRACT

A driver circuit for electronically actuating in a predetermined sequence, a plurality of solenoids (54). The driver circuit includes a single boost circuit (22) having an inductor (118) for receiving energy from a power supply and a capacitor (110) for storing a portion of this electrical energy prior to activation of a particular solenoid. The driver circuit further includes circuitry associated with each solenoid (40, 80, 82, 84) for energizing the solenoid by causing the capacitor (110) to discharge therethrough and to regenerate the stored voltage potential prior to the time for energizing another solenoid. The drive circuit further includes a current regular and mode control (70, 150, 170) to control the magnitude of current flowing through each solenoid.

16 Claims, 4 Drawing Figures

SOLENOID DRIVER USING SINGLE BOOST CIRCUIT

BACKGROUND OF THE INVENTION

1. Field of the Invention

This invention relates generally to systems for controlling electromagnetic devices having solenoids and more particularly to a control circuit having a single boost voltage circuit used to activate a plurality of electromagnetic devices.

2. Description of the Prior Art

Electronic fuel injection control system for internal combustion engines such as diesel engines may include a plurality of electromagnetically actuated fuel injection valves that are sequentially charged with a determinable quantity of fuel during a fuel metering interval and which during a subsequent interval are caused to inject this determinable quantity of fuel into the engine. Such the injector is disclosed in the commonly assigned U.S. Ser. No. 6,949 by Walter et al, now U.S. Pat. No. 4,235,374, entitled "Electronically Controller Diesel Unit Injector" which is expressly incorporated by reference. A characteristic of many electromagnetically actuated devices is that the solenoid associated therewith requires a first high level current to cause the solenoid to activate or pull in a movable member. By utilizing a second substantially lower value of current to the solenoid coil, it is possible to maintain the solenoid (injector) in an open or activated state. Furthermore, it is known in the art that to increase the speed of operation of a solenoid, it is desirable to overdrive the solenoid by applying a large first level of driving current for a limited period of time and to reduce the driving current, to the second or holding level once the solenoid has opened.

As the frequency of activation increases such as when the speed of an engine increases the injector activation and fuel metering periods get closer in time and the metered quantity of fuel must be delivered to injector at an accelerated rate. At some determinable engine operating condition, in order to deliver the metering quantity of fuel to each injector, the metering signals will begin to overlap one another. However, to operate the engine at these increased speeds it has been common practice to simultaneously inject fuel into a number of cylinders or to resort to complicated pulse width variation circuits to operate the system at high speeds.

SUMMARY OF THE INVENTION

It is an object of the present invention to solve the deficiencies in the prior art. It is a further object of the invention to rapidly and selectively operate a plurality of solenoid devices such as fuel injectors in a predetermined sequence. Another object of the invention is to provide a driver circuit for a fuel injection system to selectively operate each fuel injector during times involving overlapping metering signal intervals.

In accordance with the present invention there is provided a driver circuit for a fuel injection control system for a multi-cylinder internal combustion engine.

More particularly the present invention relates to a system and method for energizing a particular array of solenoid coils. In particular, the specific circuitry relates to a boost circuit for energizing a plurality of electromagnetic fuel injection devices. The driver circuit as illustrated in FIG. 1 or 2 comprises a blocking diode 50 which is connected in series with a particular coil 54 of an associated solenoid. The coil has another terminal connected to an electronic regulating means or amplifier 60, which when energized will permit current to flow through the coil. The driver circuit further includes a boost circuit 22, which in itself comprises a boost control 24 and boost generator 26. The boost control receives an arming signal, which causes the boost generator to regenerate a boost voltage in timed synchronization with the combustion process within each cylinder. Upon energization, the boost generator transfers electrical energy from a voltage source and stores that energy in a first storage capacitor. The boost circuit further includes an SCR gate control (40) one associated with each coil to selectively switch each associated SCR gating device into a conductive state. The driver further includes a reference current generator 150 and current regulator 170, one associated with each coil to maintain the current flowing through the coil at predetermined values. In addition, the current reference generator comprises a differentiator which insures the saturation of the output stage of the current regulator 170 during the interval when the first storage capacitor is discharging through the coil 54 and sense resistor 64. The driver further includes an on/off control responsive to control signals for selectively switching the amplifier 60 into conductive and nonconductive states therein initiating periods of coil activation and deactivation.

The present invention having the above features provides the following advantages:

The provision of the single boost circuit reduces the cost of the fuel system and provides for uniform, repeatable and rapid opening of each solenoid. The utilization of a low level hold current decreases the power requirements of the system and related heat dissipation problems. The SCR gate control in cooperation with the boost circuits permits efficient system operation for wide ranges of metering pulse width intervals including conditions defined by overlapping metering intervals while not requiring complicated circuitry to prematurely terminate a particular metering pulse width.

Many other objects, features and advantages of the present invention will be clear from the detailed description of the drawings.

DETAILED DESCRIPTION OF THE DRAWINGS

Figure 1:
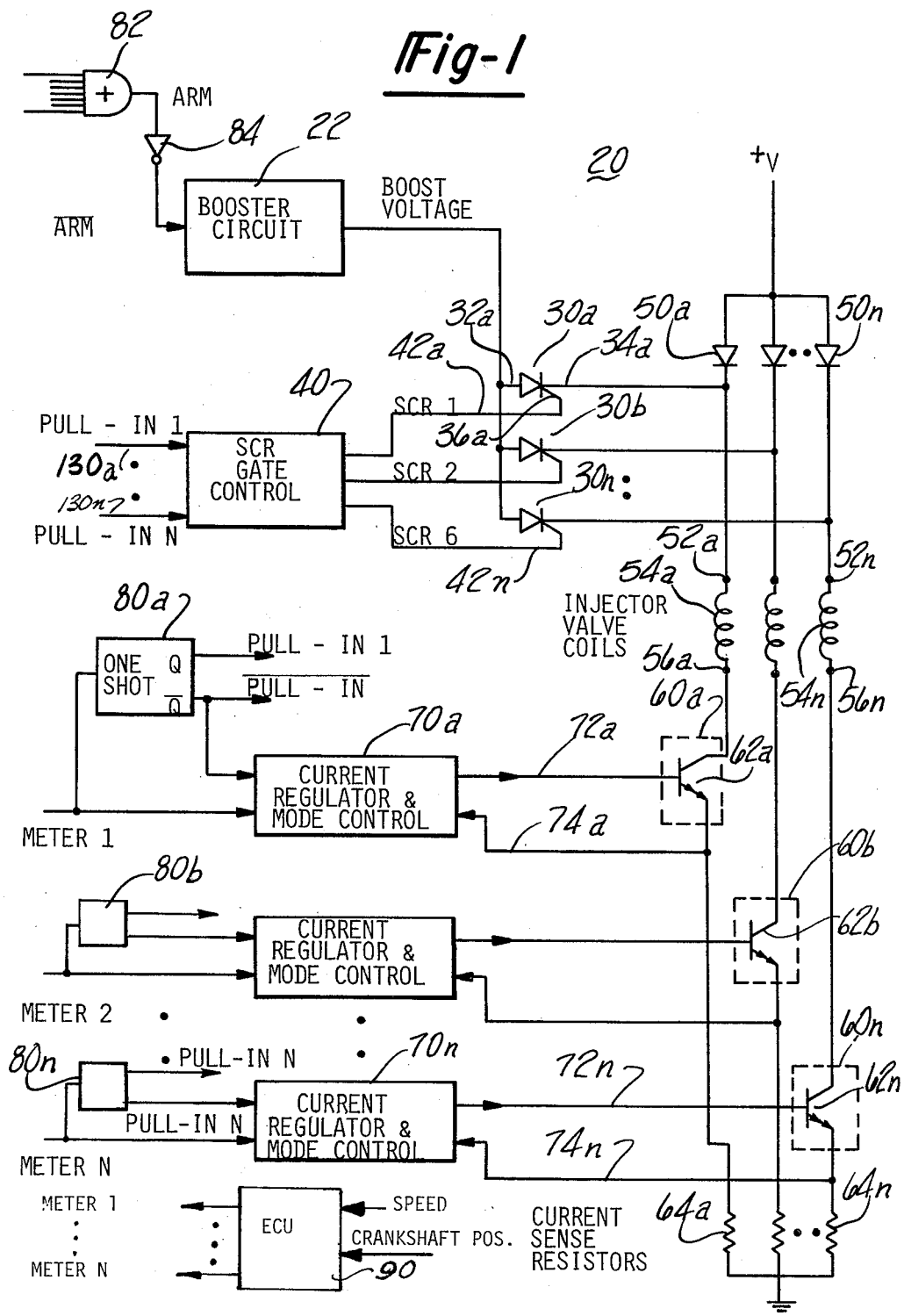
FIG. 1 is a block diagram of the preferred embodiment of the present invention.

A Multiple Injector High Performance Drive System 20 is illustrated in FIGS. 1. System 20 employs a single booster circuit 22 to assist in developing sufficient voltage to open a plurality of electromagnetic fuel injectors. The boost circuit 22 comprises a boost control 24 and a boost generator 26, which are both shown in greater detail in FIG. 2. The output of the boost circuit 22 is connected to a plurality of solid state switches such as the plurality of silicon controlled rectifiers (SCR) 30a through n where n corresponds to the number of injector coils 54a-n. Each SCR 30 contains an anode terminal 32-n, a cathode terminal 34a-n, and a gate terminal 36a-n. An SCR gate control 40 is connected to the gate terminal 36 of each rectifier 30 through a plurality of signal lines 42a-n. The system further contains a plurality of series connected circuits. Each series circuit includes a diode 50 having its anode connected to a positive voltage source and having its cathode connected to one terminal 52 of an electromagnetic fuel injection valve coil 54. Another terminal 56 of the coil 54 is connected to its respective driver 60. The output of the driver 60 is connected to one terminal of a current sensing resistor 64, the other terminal of which is connected to ground or some other suitable electrical potential. In the preferred embodiment, as shown in FIG. 1, each driver includes a Darlington pair 62. The system further includes a plurality of current regulator and mode control circuits 70a-n, each of which is connected to its associated driver 60a-n via the control lines 72a-n, respectively. Each current regulator and mode control circuit 70 is responsive to a metering signal input thereto which is generated in synchronism with a repeating engine event. The metering signals are generated by an electronic control unit (ECU) 90. One such ECU is shown in the commonly assigned U.S. Ser. No. 904,129 by C. K. Leung and is expressly incorporated herein by reference. The current regulator and mode control 70 senses the voltage appearing across each respective sense resistor 64. This feedback voltage is transmitted to each current regulator and mode control circuit 70 via a plurality of feedback lines 74a-n.

The system 20 further requires and generates additional timing and control signals: these are the pull-in and arm signals respectively. Each metering signal (meter 1 through meter n) is connected to an input terminal of one of the monostable multivibrators 80a-n. In response to each metering signal, each multivibrator 80 will generate at its non-inverting terminal ($Q$), the inverted pull-in signal, and generate at its inverting terminal ($\overline{Q}$) the pull-in signal. Each pull-in signal is routed to a respective current regulator and mode control 70. The non-inverted pull-in signal from each multivibrator 80 is connected to one of the input terminals of an OR gate 82 the output of which has been designated as the arm signal. The output of OR gate 82 is connected to an inverting amplifier 84 which generates an inverted arm signal ($\overline{arm}$) at its output terminal. The output of amplifier 84 is connected as illustrated in FIG. 1 of the booster circuit 22.

Figure 2:
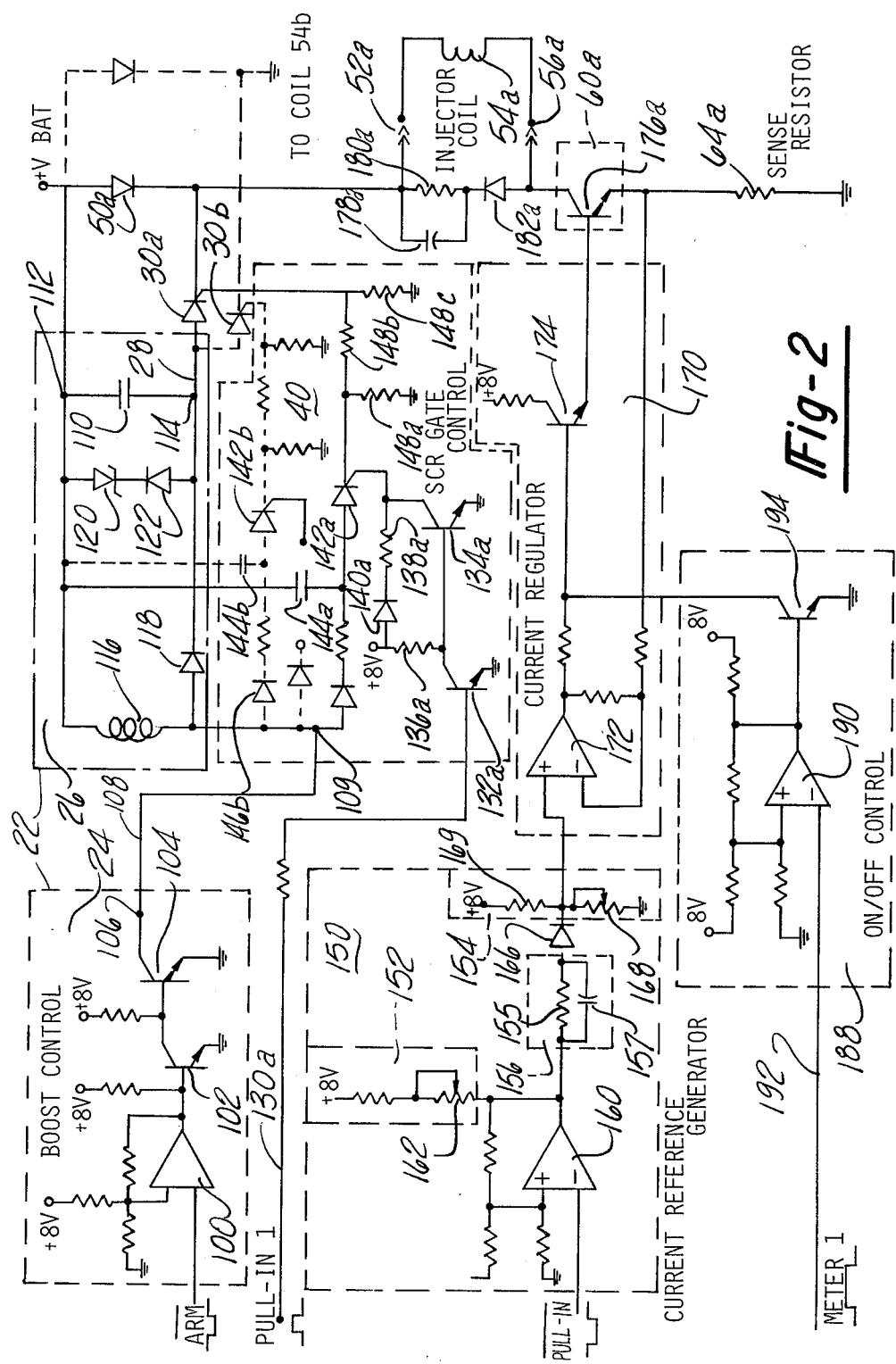
FIG. 2 is an electrical circuit diagram illustrating the circuitry to drive one of the plurality of injectors.

Reference is now made to FIG. 2, which illustrates a more detailed embodiment the circuitry, shown in FIG. 1, necessary to activate coil 54a. More particularly there is shown a boost circuit 22 comprising a boost control 24, the output of which controls the state of a boost generator 26. The boost control 24 comprises a comparator 100 receiving at its inverting terminal the inverted ARM signal. The comparator 100 is appropriately biased and functions as a lever shifter and buffer. The output of comparator 100 is connected to the base terminal of an npn transistor 102 which performs driver and signal inversion functions. The collector of transistor 102 is connected to the input of a Darlington pair 104. The output terminal 106 of the Darlington pair is connected via output line 108 to the input terminal 109 of the boost generator 26. The boost generator 26 includes a first storage capacitor 110 having a terminal 112, which is connected to the positive battery potential and terminal 114 connected via line 28 to each SCR 30 as previously described. A boost coil 116 is also connected between terminal 112 and the input terminal 109. A diode 118 is connected in common to terminals 109 to the boost coil 116 and between terminal 114. The diode 118 is poled so that current flow is in the direction of terminal 109 to terminal 114. The boost generator 26 further includes a series combination of a Zener diode 120 and blocking diode 122 connected between terminals 112 and 114. The Zener diode 120 is connected so as to regulate the voltage across the storage capacitor 110. The blocking diode 122 is connected to prevent current from flowing from terminal 112 to terminal 114. As mentioned, the output of the boost generator 26, that is terminal 114, is connected via line 28 to the anode of each SCR 30. The cathode of SCR 30a is connected to the cathode of the coupling diode 50a. The anode of the coupling diode 50a is connected in common to terminal 112 and to the positive potential voltage source such as a battery.

The SCR gate control circuit 40 receives the plurality of pull-in signals one associated with each coil via input lines 130a-n. It is apparent that only line 130a is shown in FIG. 2. The following discussion relates to the circuitry necessary to receive and condition one of these pull-in signals to appropriately activate one of the SCR's 30. It should be appreciated that the SCR gate control 40 contains a number of such circuits as hereinafter described. The pull-in signal i.e. pull-in 1 is communicated via line 130a to the base of the npn transistor 132a. The output or collector terminal of transistor 132a is connected to the base of transistor 134a, which has its emitter terminal grounded. The collector terminal of transistor 132a is connected via resistor 136a to a reference power supply potential which is less than the first voltage source, such as the 8 volt potential as indicated in FIG. 2. The collector terminal of transistor 134a is connected to this reference power supply via the resistor 138a and diode 140a series combination. In addition, the collector of transistor 134a is connected to the gate terminal of SCR 142a. The anode of SCR 142a is connected to one terminal of a second reference storage capacitor 144a. The other terminal of the reference capacitor 144a is connected to the reference power supply voltage source via terminal 112. The anode of SCR 142a is also connected to the input node 109 of the boost generator 26 via the resistor/diode combination 146a. The cathode of SCR 142a is connected to a voltage divider having resistances 148a, b and c. The gate terminal of SCR 30a is connected to the common node of resistors 148b and 148c.

Reference is now made to the phantom lines and other connected components that are shown within the SCR gate control 40. These phantom lines illustrate the suggested connection of addition components 142b, 144b etc. to permit the controlled energization of other coils such as coil 54b (see FIG. 1).

Reference is now made to one of the current regulator and mode control circuits 70 which is shown comprising a current reference generator 150 and a current regulator 170. The current regulator 150 further includes a pull-in level current adjust 152, a hold current level adjust 154 and a peaking current control 156. More particularly, the current reference generator includes an input comparator 160 receiving at its inverted input an inverted pull-in signal (pull-in 1). Comparator 160 operates as a voltage level shifter and buffer having its output connected via potentiometer 162 to a reference voltage source such as the 8 volt reference. The potentiometer 162 provides the pull-in current level adjustment.

The output of comparator 160 is also connected to the parallel combination of the resistor-capacitor peaking current control circuit 156. The peak current control circuit 156 may be a differentiator and insures a sufficient level of high voltage to saturate the output (transistor 174) of the current regulator 170 until the boost voltage from capacitor 110 is dissipated. The output of the peaking current adjust 156 is connected to the anode of the blocking diode 166, the cathode of which is connected to the hold adjust circuit which comprises potentiometer 168. The cathode of the blocking diode 166 is further connected to the input of the current regulator 170. The input to the current regulator 170 comprises the noninverting input terminal of operational amplifier 172. The output of operational amplifier 172 is connected via a voltage divider to the base of npn transistor 174, the emitter terminal of which is connected to the input or base terminal of the driver 60a. Driver 60a comprises the Darlington pair 176a. The emitter of the Darlington pair 176a is connected to one terminal of the sense resistor 64a. The other terminal of the sense resistor 64a as indicated is grounded. The emitter output of the Darlington pair 176a is communicated via a feedback resistor to the inverting input terminal of the operational amplifier 172a therein creating a current sensing feedback path.

The cathode terminal of SCR 30a and the coupling diode 50a are connected to the input terminal of a transient suppressor comprising the parallel combination of capacitor 178a and resistor 180a. The input terminal of this parallel combination is also connected to the input terminal 52a of the injection coil 54a. The other terminal of the transient suppressor is connected to the cathode of the blocking diode 182a. The anode of blocking diode 182 is connected to terminal 56a of coil 54a. The anode of diode 182a and terminal 56a of the coil 54a are connected to the collector terminal of the Darlington pair 176a.

Each current regulator and mode control 70 further includes an on-off control 188 comprising a level switching comparator 190 receiving at its inverting input via line 192 a metering signal such as meter 1. The output of the level switching comparator 190 is connected to the base terminal of an inverting transistor 194. The collector of transistor 194 is connected to the base terminal of transistor 174.

Figure 3:
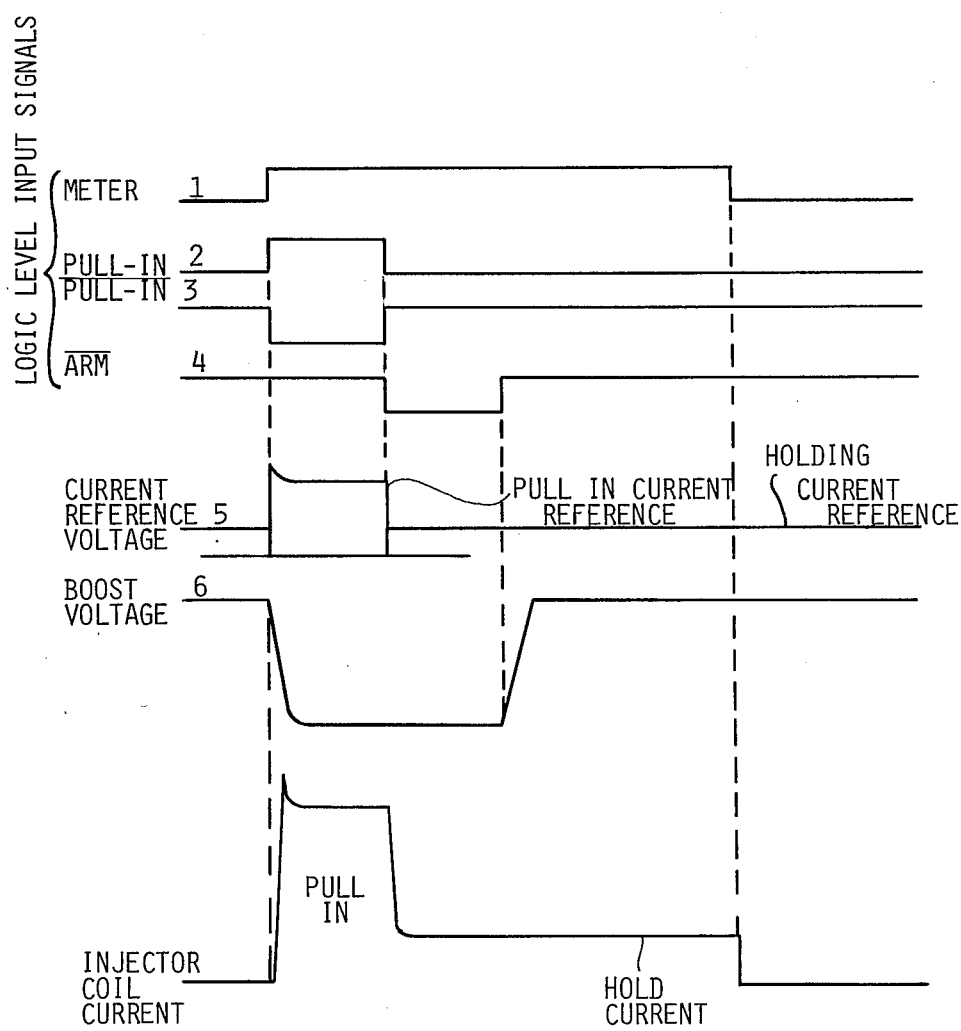
FIG. 3 illustrates the wave forms generated by the circuit of FIG. 2.

Reference is now made to FIG. 3, which illustrates the operation of the circuit disclosed in FIGS. 1 and 2 during an illustrative single coil activation or fuel injection event. In response to a previous ARM signal (the inverted ARM signal, $\overline{ARM}$, is shown on line 4 of FIG. 3) the boost voltage (line 6, FIG. 3) will be maintained at a quiescent voltage level. It should be realized that the boost voltage illustrated in line 6 represents the voltage stored on the storage capacitor 110 which is typically greater than the voltage level of the reference power supply. In the quiescent condition the coil current, which is shown in line 7 of FIG. 3, is zero. The operation of the booster circuit 22 comprising the boost control 24 and the boost generator 26 is as follows: As the inverted ARM signal (ARM) goes low, current is drawn from the battery through the boost coil 116 and the Darlington pair 104 to ground. When the ARM signal goes high, the Darlington pair 104 is turned off, causing a capacitor charging current path to exist wherein the current which is flowing through the booster coil 116 now flows through diode 118 to charge the storage capacitor 110. Part of the current flows through the diode resistor 146 and charges each capacitor 144. As previously mentioned, the boost generator circuit 22 includes a Zener diode 120 and diode 122 series combination. The Zener diode 120 limits the voltage across the capacitor 110 and also provides a relatively constant reference voltage thereacross. In the preferred embodiment, the Zener diode 120 provides a 130–140 volt reference however, this voltage is dependent on the coil characteristics and can be any level. The purpose of the diode 118 is to prevent the voltage on the charged capacitor from being returned to the coil 116. Diode 122 prevents current from flowing through the Zener diode 120 in the forward direction after the boost is dissipated. The boost generator 22 is coupled to the battery through diode 50. This direct coupling of the battery to the coil 54 and other sections of the circuit permits battery current to flow automatically when the voltage on the storage capacitor 110 becomes less than the forward voltage of diode 50. The SCR gate control 40 receives at its input a pull-in signal on input line 130. Each pull-in signal may be derived from a particular meter signal which is related to a periodic activation or engine event such as a crankshaft position. The meter signals may be derived in a known manner from any of the known variety of crankshaft position sensors or electronic control units. The occurrence of the positive pull-in signal causes transistor 132 to become conductive, therein causing the voltage at the collector of transistor 132 to approach ground potential. This voltage potential is communicated to the base of transistor 134 and is of such magnitude as to return transistor 134 to a nonconducting state. At this point the gate terminal of SCR 142 is activated. The voltage appearing across the storage capacitor 144 upon the activation of SCR 142 is applied to the voltage divider 148, which in turn acitvates SCR 30. Upon the activation of SCR 30 by the postive pull-in signal the stored energy in the storage capacitor 110 is caused to flow through the coil 54, assuming, of course, that a particular driver stage 60 has been so activated by an associated on-off control 188. Each SCR 30 requires that the gate potential be higher than the cathode potential in order to trigger it. A fraction of the boost energy is diverted to obtain a higher voltage to fire SCR 30. This is accomplished in the preferred embodiment using the diode-resistor 146, capacitor 144, SCR 142, and resistors 148.

During these injector coil activation periods, which span the duration of each meter signal the path of current flow is from the storage capacitor 110 or from the battery through a particular injector coil 54 and through a driver 60. During periods when the driver 60, which can be the Darlington pair 176 is turned off, current flows from the coil 54 through diode 182 and into the resistor capacitor combination 178—178. In this manner the resistor-capacitor combination 178-180 provides transient suppression during coil activation periods as well as a discharge path during nonactivation periods for the coil current.

When the metering signal goes high, comparator 190 becomes activated, which in turn places transistor 194 into a cut-off state. When transistor 194 is placed into a cut-off state, the base of transistor 174 is placed at approximately ground potential. This in turn activates the Darlington pair 176 to permit current flow from the storage capacitor 110 through the injector coil 54 and through the sense resistor 64 to ground.

Reference is made to the current reference generator 150 and the current regulator 170 which controls the pull-in and hold current. Normally, current is supplied by op amp 172 to the base of transistor 174 during metering. During this interval transistor 194 is biased off. When the meter signal goes low, transistor 194 conducts and diverts the base current of 174, effectively cutting off the drive current to coil 54.

The output of the current reference generator 150 is a voltage waveform is shown in FIG. 3. Normally, the inverted pull-in signal which is connected to the inverting input of comparator 160 is in a high state, causing its output to be near ground potential. In this condition, diode 166 is reverse-biased, essentially isolating the peak current control 156. The current reference voltage is determined by the hold current adjust voltage divider 154. In addition, in this state, the capacitor in the peak current control 156 will discharge to zero volts.

When the metering pulse is initiated, it is desired to regulate the current flowing through coil 54 to the higher pull-in current. At that point in time, the inverted pull-in signal, connected to comparator 160, goes to a low voltage e.g. near ground. The output comparator 160 which is essentially an open collector device, goes to a high impedance state. When this occurs, the pull-in adjust 152 and peak current control 156 cause diode 166 to become forward-biased. The net effect of this is to cause the voltage at the cathode of diode 166 to be higher, due to the additional parallel resistance. The current reference voltage is now determined by the voltage divider which consists of the hold adjust 168 and the parallel combination resistor 169 and the series circuit of the pull-in adjust and peak current control.

At the instant the inverted pull-in pulse goes low, the capacitor 157 in the peak current control 156 is discharged and effectively shorts out the resistor 155. This initial lower resistance causes the current reference voltage to have a slight overshoot, or peak, at the start to insure that the output stage of the driver remains saturated long enough to dissipate all of the boost energy and indeed get up to the pull-in current as fast as possible.

Figure 4:
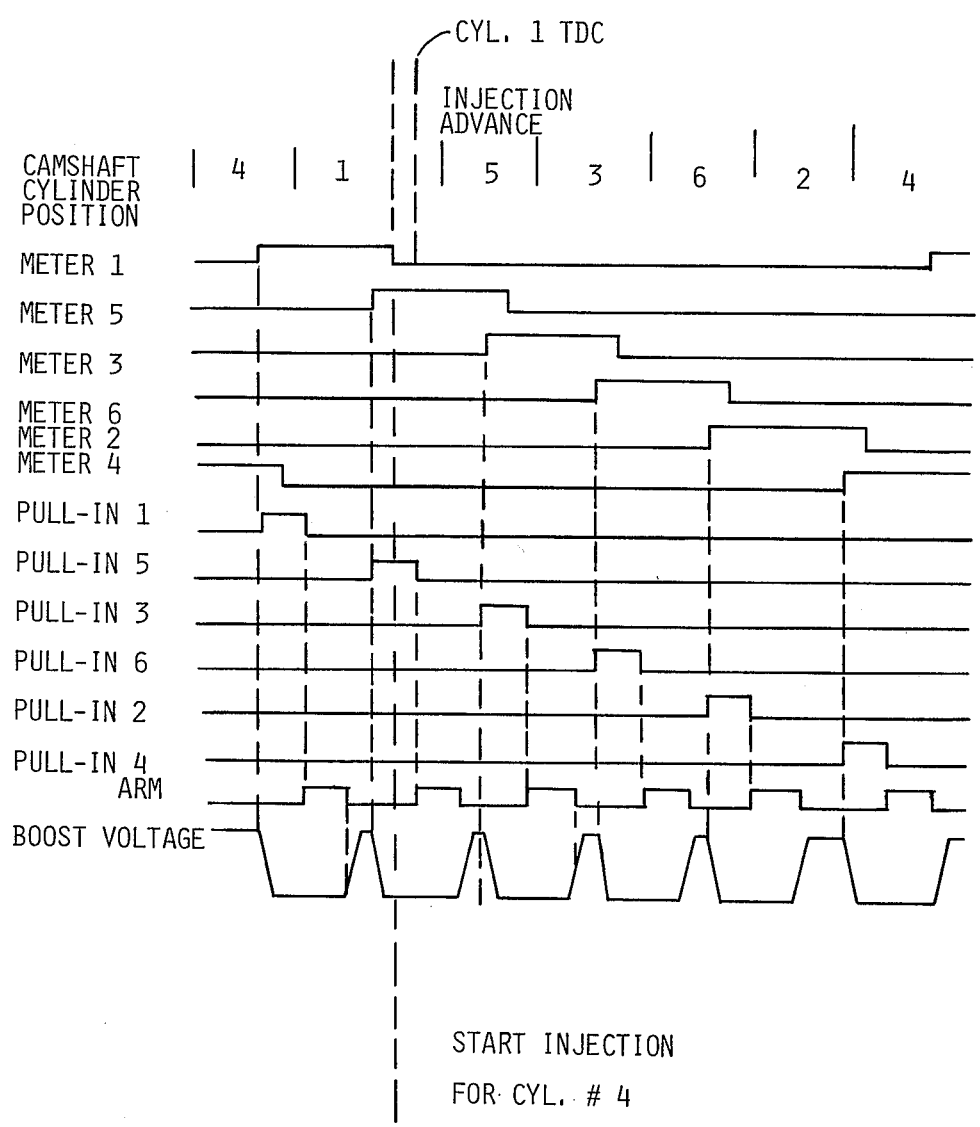
FIG. 4 illustrates the wave forms generated by a control system which is designed to energize six electromagnetic fuel injector valves.

Reference is now made to FIG. 4 which is a timing diagram for a system with six high pressure common rail injectors. When using this type of injector fuel injection occurs at the end of each metering or activating period, as shown in FIG. 4. The duration of the metering signal, as well as the injection advance, are generated as a funciton of engine parameters in a known manner by the electronic control unit 90. The duration of the pull-in signal would generally be fixed for any given application and is generally a function of the solenoid valve, as is the pull-in current level and boost voltage. Variable duration pull-in signals may also find application under certain circumstances. Pull-in always occurs at the beginning of the valve coil energization period (in this case at the start of metering, as shown in FIG. 4). The arming signal duration is usually a fixed time period for a given valve coil and is determined by the valve coil parameters and the boost circuit parameters. Arming generally occurs at some convenient point in time when the circuit is not being used. For this application, arming would take place immediately following pull-in.

One of the advantages of the present invention is that the single boost circuit 22 can effectively drive a plurality of injector coils 54 during periods of excessive engine speeds. During these periods of high engine speed, the corresponding engine revolution period is proportionately reduced therein requiring that the metering signals for each injector be generated with a characteristic pulse overlap as illustrated in FIG. 4. FIG. 4 further illustrates the time synchronization of the respective metering and pull-in signals and the resultant boost voltage pulse train generated in response thereto.

Many changes and modifications in the above-described embodiment of the invention can of course be carried out without departing from the scope thereof. Accordingly, the scope of the invention is intended to be limited only by the breadth of the appended claims.

What is claimed is:

1. A system for energizing a number of electromagnet devices, the system adapted to receive a plurality of electrical metering pulses, one pulse associated with each device, for activating particular devices, comprising:

a voltage source;

a plurality of electromagnetic devices, each device including a solenoid having a coil having a first terminal connected to said voltage source and a second terminal;

regulating means one associated with each said device for selectively permitting current to flow through specified ones of said devices;

current sensing means connected to each of said regulating means for sensing the level of current flowing through a specific one of said devices;

driver means one associated with each of said devices, connected in series with said coil and said current sensing means for establishing a current flow path therethrough in response to a particular metering signal;

diode means (50) connected in series with said voltage source and the said coil of each of said devices;

boost generator means connected to said voltage source and to each of said devices for periodically generating, prior to each metering pulse, a boost voltage energization signal having a voltage potential greater than the voltage potential of said voltage source;

signal means for generating a pull-in signal in response to the initiation of each of the metering signals wherein the duration of each of said pull-in signals is a determinable fraction of the duration of a particular one of said metering pulses;

boost control means responsive to the plurality of said pull-in signals for causing said boost generation means to regenerate said energization signal;

gate means (30) one associated with each of said devices, having an activation and deactivation states of operation, for controlling the application of the energization signal during the activation state to its associated one of said devices;

gate control means responsive to a particular one of said pull-in signals for controlling the state of said gate means.

2. The system as recited in claim 2 wherein each of said pull-in signals is of a fixed duration.

3. The system as recited in claim 1 wherein said gate means comprises an SCR (32) having its anode terminal connected to the output of said boost generation means, its cathode terminal connected to the common point of said diode means and said device and further having its gate terminal connected to the output of an associated one of said gate control means.

4. The system as recited in claim 3 wherein said gate control means comprising:
   level shifting means (132, 134) for receiving and for buffering an associated one of said pull-in signals;
   switch means interposing said level shifting means and said gate terminal of said SCR for energizing said gate terminal.

5. The system as recited in claim 4 wherein said switch means includes a second SCR (142) having cathode, anode and gate terminals wherein said gate is connected to the output of said level shifting means, said cathode terminal is connected to said gate terminal of an associated one of said SCR (32); and
   said gate control means further includes a storage capacitor means (144) having a first terminal connected to said voltage source and further having a second terminal connected to the anode of said second SCR for storing a portion of said energization signal and a diode-resistor series combination (146) wherein the anode terminal of said diode is connected to the output of said boost control means and one terminal of said resistor is connected to said second terminal of said storage capacitor means.

6. The system as recited in claims 1 or 4 wherein said system further includes:
   current reference generator means (150), one associated with each said device, responsive to said pull-in signals for generating a first and a second reference current level wherein said first reference current level is greater than or equal to the value of current necessary to activate a particular one of said device and wherein said second reference current level corresponds to a level of current necessary to hold said device in an open or activated state;
   current regulator means (170) connected to said current reference generator means and to said current sensing means for regulating the current flowing through said device in accordance with said first and second reference current level.

7. The system as recited in claim 6 wherein said current sensing means comprises a sence resistor connected to said second terminal of said device.

8. The system as recited in claim 7 wherein said current reference generator means includes:
   hold current adjust circuit means for establishing said second reference current level;
   pull-in current adjust circuit means for establishing said first reference current level;
   peak current level time constant circuit means for shaping the peak current level of the pull-in current to maintain said switch means (60) in a saturated state during the interval that energy is being dissipated through said solenoid and said sense resistor;
   level shifter adapted to receive a third signal which is the complement of said pull-in signal, the output of which is connected in common to said pull-in current adjust circuit means and said peak current level time constant circuit means; and
   a diode having its anode connected to the output of said peak current level time constant circuit means and having its cathode connected to said hold current adjust time constant circuit means and also connected to said current regulator means.

9. The system as recited in claim 8 wherein said boost control means comprises:
   an OR gate receiving each of said pull-in signals;
   inverting amplifier means for inverting the output of said OR gate;
   level shifting means receiving at an inverting signal input terminal the output of said inverting amplifier means for buffering the received signal;
   NPN transistor having its base terminal connected to the output of said level shifting means, and having its emitter terminal connected to a second voltage potential; and
   output driver means, having an output terminal connected to said boost generator means for applying a control signal to the input terminal of said boost generator means.

10. The system as recited in claim 9 wherein said current regulator means further comprises:
    an amplifier responsive to said output of said current reference generator and to the voltage across said sense resistor;
    on/off control circuit responsive to a particular metering pulse;
    output transistor (174) of the NPN type having its base connected to the output of said amplifier and the output of said on/off control circuit, the collector of said output transistor connected to said second voltage reference potenial having a magnitude less than said first reference level and having its emitter terminal connected to the input of said driver means and wherein said on/off control circuit includes:
    second level switching means (190) receiving at an inverting signal input terminal a particular metering pulse for buffering said metering pulse, a second transistor of the NPN type having its base terminal connected to the output of said second level switching means and having its cathode terminal connected to the base of said output transistor.

11. The system as recited in claim 10 wherein said boost generator means comprises:
    first means for removing from said first voltage source a first value of electrical energy in response to control signals input thereto;
    second means for receiving electrical energy from said first means and for storing a voltage potential therein.

12. The system as recited in claim 11 further including:
    metering means for generating a plurality of sequentially initiated metering pulses wherein each of said metering pulses is of a determinable duration.

13. The system as recited in claim 12 wherein said device is a fuel injector, adapted to receive fuel, of the type having means for generating a fuel metering mode initiated in response to a particular one of said metering signals for storing a determinable quantity of fuel therein and having means for generating an injection mode for ejecting said stored quantity of fuel therefrom in correspondence with the termination of said metering signal.

14. The system as recited in claim 13 wherein said metering means comprises means for generating a train of pulses wherein subsequently generated metering pulses overlap the immediately preceding pulse.

15. A system for energizing a number of electromagnet devices from a voltage source, the system adapted to receive a plurality of electrical metering pulses, one pulse associated with each device, for an activating particular device, comprising:
- a plurality of electromagnetic devices, each device including a solenoid having a coil having a first terminal adapted to be connected to said voltage source and a second terminal;
- regulating means, one associated with each said device, for selectively permitting current to flow through a specified one of said devices;
- current sensing means connected to each of said regulating means for sensing the level of current flowing through a respective one of said devices;
- driver means one associated with each of said devices, connected in series with one of said coils and its respective said current sensing means for establishing a current flow path therethrough in response to a particular metering signal;
- diode means connected in series with the voltage source and the said coil of each of said devices;
- boost generator means connected to the voltage source and to each of said devices for periodically generating, prior to each metering pulse, a boost voltage energization signal having a voltage potential greater than the voltage potential of the voltage source;
- signal means for generating a pull-in signal in response to the initiation of each of the metering signals wherein the duration of each of said pull-in signals is a determinable fraction of the duration of a particular one of said metering pulses;
- boost control means for generating at least one arm signal to cause said boost generation means to regenerate said energization signal;
- gate means one associated with each of said devices, having an activation and deactivation states of operation, for controlling the application of the energization signal during the activation state to its associated one of said devices;
- gate control means responsive to a particular one of said pull-in signals for controlling the state of said gate means.

16. The system as defined in claim 2 or 15 wherein said boost control means includes means for generating said at least one arm signal in response to at least one of said pull-in signals.

* * * * *